United States Patent [19]
Esposito et al.

[11] Patent Number: 6,139,762
[45] Date of Patent: Oct. 31, 2000

[54] METHODS FOR MANUFACTURE OF ELECTRONIC DEVICES

[75] Inventors: Christopher P. Esposito, Plymouth, Mass.; Takahiro Kobayashi, Sasakomi-mura; Masaki Kondoh, Toyosaka, both of Japan; Martin W. Bayes, Hopkinton, Mass.

[73] Assignee: Shipley Company, L.L.C., Marlborough, Mass.

[21] Appl. No.: 09/210,555

[22] Filed: Dec. 11, 1998

[51] Int. Cl.⁷ .................................................. H05R 3/00

[52] U.S. Cl. ................................. 216/39; 216/17; 216/18

[58] Field of Search .............................. 216/17, 18, 19, 216/39

[56] References Cited

U.S. PATENT DOCUMENTS

| | | |
|---|---|---|
| 3,962,496 | 6/1976 | Leech ....................................... 427/306 |
| 4,316,322 | 2/1982 | Tranberg . |
| 4,515,829 | 5/1985 | Deckert et al. . |
| 4,597,988 | 7/1986 | Kukanskis et al. . |
| 5,132,038 | 7/1992 | Kukanskis et al. . |
| 5,747,098 | 5/1998 | Larson ....................................... 427/58 |

*Primary Examiner*—Richard Bueker
*Assistant Examiner*—Alva C Powell
*Attorney, Agent, or Firm*—Peter F. Corless; S. Matthew Cairns; Darryl P. Frickey

[57] ABSTRACT

The present invention relates to new methods for manufacturing electronic packaging devices, particularly printed circuit boards. Methods of the invention include use of reduced pH sweller and etch treatments that can produce printed circuit boards and other devices that are substantially more robust and reliable than produced by prior methods.

18 Claims, 1 Drawing Sheet

METHODS FOR MANUFACTURE OF ELECTRONIC DEVICES

BACKGROUND OF THE INVENTION

1. Field of the Invention

The present invention relates to new methods for manufacturing electronic devices, particularly printed circuit boards and other packaging devices. Methods of the invention include sweller and etch treatments that produce printed circuit boards and other devices that are substantially more robust and reliable than those produced by prior methods.

2. Background Art

Double-sided and multilayer printed circuit boards are used for a variety of applications and provide notable advantages of conservation of weight and space. A multilayer board is comprised of two or more circuit layers, each circuit layer separated from another by one or more layers of dielectric material, which generally is a resin/prepreg composite. Circuit layers are formed from copper clad laminate. Printed circuits are then formed on the copper layers by techniques well known in the art, for example print and etch to define and produce the circuit traces. As referred to herein, the term "multilayer printed circuit board" is inclusive of both double-sided boards and boards with greater than two circuit layers.

One traditional method for fabricating multilayer boards comprises fabrication of separate innerlayers having circuit patterns disposed over their surface. A photosensitive material is coated over the copper surfaces of a copper clad innerlayer material, imaged, developed and etched to form a conductor pattern in the copper cladding protected by the photosensitive coating. After etching, the photosensitive coating is stripped from the copper leaving the circuit pattern on the surface of the base material. Following formation of the innerlayers, a multilayer stack is formed by preparing a lay up of the innerlayers, ground plane layers, power plane layers, etc., typically separated from each other by a dielectric prepeg (a layer containing glass cloth impregnated with partially cured material, typically a B-stage epoxy resin). The stack is laminated to fully cure the B-stage resin.

Interconnections or through-holes, buried vias and blind hole interconnections (in general, "aperatures") are used to electrically interconnect circuit layers within a multilayer board. Buried vias are plated through holes connecting two sides of an innerlayer. Blind vias typically pass through one surface of the stack and pass into and stop within the stack. Regardless of the form of the interconnection, holes are generally drilled at appropriate locations through the stack, catalyzed by contact with a plating catalyst and metallized to provide electrical connection between the layers. This manufacturing process can pose some notable problems such as drill wear, smear and hole size limitations, all inherent in such a drilled board approach.

A more recent approach to multilayer circuit board manufacture that can avoid such drilled board problems includes sequential formation of board layers using plating techniques and imaging or laser ablation of dielectric materials to achieve fine line resolution and interconnections between circuits. Such a manufacturing process has been disclosed in U.S. Pat. No. 4,902,610.

In the manufacture of circuit boards and other electronic packaging devices, surface roughening and resin desmear of through holes and other apertures are performed chemically prior to metal plating of same to provide electrical interconnection. That roughening and desmear chemical treatment enhances the bond strength and electrical performance of the metal deposited on the aperture surface. That chemical treatment also removes resin smear such as from the board inner layer, enhancing metal-on-metal bonding. Resin smear is recognized herein to include any residual resin on copper or innerlayer of a circuit board or other device, such as may occur from drilling, incomplete development from photolithography, residues from laser ablation, detc. The roughening and desmear treatments is often referred to as "swell and etch" chemistry or treatment. The sweller formulation penetrates into and softens the resin of the circuit board or other device. The subsequently applied resin etch then oxidizes and in some cases can dissolve the polymer.

SUMMARY OF THE INVENTION

We have now found new methods for producing printed circuit boards and other electronic packaging devices that are substantially more robust and reliable than devices produced by prior methods.

More particularly, in a first aspect of the invention, methods of the invention employ sweller and/or etchant chemistry have a reduced pH (i.e. less basic) relative to prior systems. Resin aperture walls of an electronic device substrate are contacted with such compositions prior to plating. It is generally preferred that at least one of the sweller and etch formulations has a pH (as determined at 25° C.) of 13 or less, more preferably about 12 or less, still more preferably about 11, 10, 9, 8 or less, or even substantially neutral. Preferably, both the sweller and etch compositions have such a reduced pH. It has been surprisingly found that use of such less alkaline chemistries can produce a device that is more robust and reliable than devices produced by prior methods.

Without being bound by theory, it is believed that the reduced pH sweller and etch treatments of the invention result in reduced concentrations of ionic species (particularly cationic species such as $Na^+$, $K^+$, etc.) remaining on or in the processed electronic packaging device. It is also believed that ionic contamination in printed circuit board and packaging device manufacture can cause significant performance problems, including problems with migration current, dielectric breakdown, reduction of sensitivity, shorts and blisters. See, for instance, the comparative results shown in the examples below.

In another aspect of the invention, the circuit board or other device is treated with an organic acid after a resin etch step. We have found that such post-etch organic acid treatment also can produce a device that is more robust and reliable than devices produced by prior methods.

Without being bound by theory, it is believed the organic acid reduces the ionic concentration present on the processed device, e.g. by penetrating into the resin of dielectric layer(s) of aperture walls and removing ionic species that may have been deposited through prior processing. As discussed above, it is believed that ionic contamination in printed circuit board and other electronic device manufacture can cause significant performance problems.

We also have found that the sweller and etch compositions and methods of the invention can effectively treat small diameter apertures on circuit boards and other devices. Current advanced products often have extremely small diameter through-holes and other apertures, e.g. apertures having a diameter of less than 0.5 mm, and even diameters as small as 0.4 mm, 0.3 mm or 0.2 mm, or even smaller dimensions such as dimaters of 0.1 mm or less e.g. about 0.05 mm. Prior treatment systems have not effectively processed such small diameter features, resulting in less than ideal plating of the features and consequently poor electrical performance of the completed device. Preferred sweller and etch compositions of the invention have a surface tension of about 60 dynes/cm or less, more preferably about 50 dynes/cm or less, still more preferably about 40 dynes/cm or less. Typically preferred sweller and etch compositions of the invention exhibit a surface tension of from about 30 to 40 or 50 dynes/cm.

It has further been surprisingly found that use of sweller and/or etch compositions of the invention can produce an enhanced resin etch rate relative to relative to etch rate achieved with prior higher pH compositions.

As referred to herein, the term "aperature" of a device substrate refers to any of a variety of openings that are subjected to plating, such as, but not limited to drilled, photoimaged or laser drilled through-holes of printed circuit boards, drilled, photoimaged or laser drilled buried vias, blind hole interconnections, etc. Additionally, references herein to pH values of a composition designate a pH value measured with the specified composition at 25° C.

Other aspects of the invention are discussed infra.

DETAILED DESCRIPTION OF THE INVENTION

Figure 1:
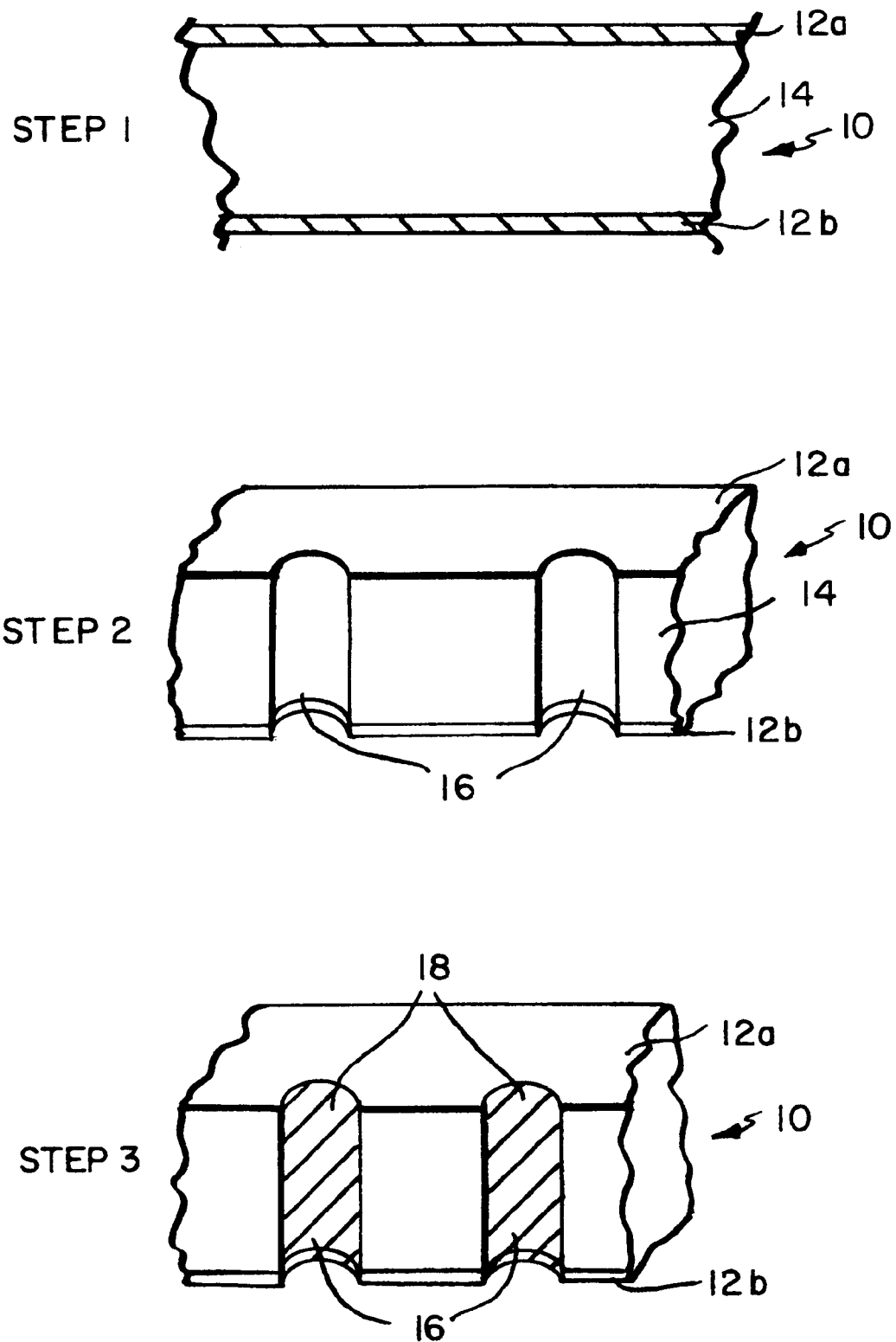
FIG. 1 illustrates schematically a preferred method of the invention.

As discussed above, in a first aspect of the invention, sweller and etch compositions are employed wherein at least one of those compositions has a reduced pH relative to prior swell and etch systems. Typically the sweller and/or etch compositions of the invention have a pH of about 13 or less, and are at least substantially, essentially or completely free of an added hydroxide component such as NaOH or KOH. An "added" hydroxide component refers herein to a hydroxide source such as NaOH or KOH that is intentionally added to a sweller or etchant composition, rather than a hydroxide species that may be formed in situ in a sweller or etchant composition.

In another aspect of the invention, the circuit board or other electronic device is treated with an organic acid after a resin etch step. Preferred organic acids for such ionic removal have relatively low molecular weights to facilitate penetration of the acid into a dielectric layer. For example, preferred acids include those that have a molecular weight of about 500 or less, more preferably about 300 or less, still more preferably about 200 or less, even more preferably a molecular weight of from about 30 to about 150 to 200. A molecular weight of from about 80 or 85 to about 150 or 200 is particularly preferred.

Generally preferred organic acids have from 2 to about 20 carbon atoms, more preferably 2 to about 10 or 12 carbon atoms. Acids that have one or more carboxyl (i.e. —COOH) groups are generally preferred. Preferred organic acids also may contain one or more hydroxy group. Somewhat less preferred are organic acids that comprise a sulfonic (—SO₃) acid group. Specifically preferred acids include e.g. propionic acid, lactic acid and acetic acid, suitably used in combination with glycolic acid, It is further preferred that a relatively a substrate is treated with a relatively concentrated amount of the organic acid. For example, it is preferred to treat a substrate with a formulation that contains at least about 5 weight percent of the organic acid, more preferably at least about 10 weight percent of the organic acid, still more preferably at least about 15, 20, 25, 30 or 40 weight percent of the organic acid. An aqueous formulation containing the organic acid in such concentrations is generally preferred.

In a typical process, a circuit board or other electronic device substrate is subjected to swell and etch treatments and then treated with an aqueous solution of the organic acid. A circuit board or other device substrate is preferably immersed in an aqueous acidic solution. Suitable immersion dwell times can vary, e.g. for 0.5 or 1 minute to 5 minutes or more, or even 10 minutes or more. Suitable dwell times can vary with penetration of the acidic solution into a resin layer of the treated substrate, and preferred dwell times can be readily determined empirically for any particular substrate. The aqueous acidic solution may be employed at an elevated temperature, e.g. at least about 30° C., more preferably at least about 40° C. A solution temperature of about 45° C. is particularly preferred. A lactic acid aqueous solution has been found to be particularly preferred such as a 30 wt % lactic acid aqueous solution.

The organic acid treatment of the invention may occur before or after a post-etch neutralization step, or may be combined with a post-etch neutralization step. Preferably, the organic acid treatment is combined with the neutralization step. A post-etch neutralization step typically comprises treatment with a strong acid such as sulfuric acid to reduce and remove manganese species present on the device from the preceding etch step. The organic acid, preferably present in the relatively high concentrations discussed above, may be formulated with such a strong acid.

Referring now to FIG. 1 of the drawings, which shows preferred processes of the invention, in Step 1, substrate 10 is provided which suitably may be a copper foil or a copper clad substrate, e.g. a double-sided printed circuit board substrate with outside copper layers 12a and 12b that encase a resin-prepreg layer 14. While FIG. 1 depicts treatment of a printed circuit board substrate, it should be understood that a wide variety of other electronic device substrates can be treated in accordance with the present invention. For example, "MID" substrates, i.e. molded interconnect device substrates, can be treated in accordance with the present invention, in the same manner as described herein for treatment of a printed circuit board. Electronic shielding devices such as may be used for a computer housing or other electronic devices also may be treated in accordance with the invention. The treatment methods and compositions of the invention also may be employed in KGD microelectronic wafer tester fabrication and to build up tab tops for electronic devices. Treatment methods and compositions of the invention also may be employed in low dielectric wafer production and wafer level CSP (chip scale package). In general, the methods and compositions of the invention may be employed for a wide variety of plating on plastic applications, and is particularly useful for electronic device manufacture.

In Step 2, the circuit board substrate 10 is shown in cut-away view wherein through-holes 16 have been made between layers 12a and 12b to enable electrical interconnection therebetween. The through-holes can be generated by direct drilling through the board layers, or by photoimaging or laser imaging the through-holes in a sequential multilayer board production process. See U.S. Pat. No. 4,902,610; C. Coombs, *Printed Circuits Handbook* (3$^{rd}$ ed. McGraw-Hill); and T. Kiko, *Printed Circuit Board Basics* (1$^{st}$ ed. PMS Indus.), for discussions of such through-hole fabrication.

The surfaces of through-holes 16 are treated in accordance with compositions of the invention prior to plating of those walls.

Thus, in a first aspect of the invention, after through-holes 16 or other apertures are formed, the exposed resin (dielectric) walls of those aperatures are treated with sweller and etch solutions of the invention that have a reduced pH as discussed above.

As discussed above, preferred sweller solutions of the invention have a pH (as determined at 25° C.) of 13 or less, more preferably about 12 or less, still more preferably about 11, 10, 9, 8 or less, or even substantially neutral, or even acidic, e.g. a pH of about 6 or less, or even a pH or about 4, 3, 2 or less.

Suitable sweller compositions of the invention may be aqueous formulations, or may be polar organic solvent formulations, or may be a solution that is a combination of water and a polar organic solvent that is preferably water-miscible. It is generally preferred to include an organic solvent in the formulation to facilitate treatment of the organic dielectric layer(s). Suitable organic solvents for use in sweller compositions are preferably miscible with water and include e.g. ethers, alcohols, amides, etc. such as glycols e.g. diethylene glycol; ethers such as butyl ether; a dipolar aprotic solvent such as N-methyl pyrrolidinone; and the like. The sweller solution may optionally contain a base component. If an alkaline component is included in the sweller composition, it preferably is a relatively weak base to maintain the composition at a preferred pH as mentioned above. For instance, suitable bases for use in a sweller composition include e.g. a carbonate such as $Na_2CO_3$ or $NaHCO_3$; organic bases such as organic amines e.g. triethanolamine and monoethanolamine; substituted ammonium compounds such as tretramethylammonium hydroxide; and the like. Additionally, although less preferred, the sweller composition may contain stronger bases (e.g. KOH or NaOH) provided the etchant composition is at a reduced pH.

A printed circuit board or other substrate is suitably treated with a sweller composition of the invention by immersion, preferably with agitation of the sweller composition. The sweller composition is suitably employed at an elevated temperature, e.g. at least about 40° C., 50° C. or 60° C., more typically about 70° C. or greater. Residence times of the substrate within the sweller composition can vary, e.g. 1 minute or more, to 3, 4, 5, 6, 7, 8, 9 or 10 minutes or more. See Example 1 which follows for a preferred sweller composition of the invention and preferred conditions of use of the composition.

After sweller treatment, printed circuit board substrate 10 or other electronic device substrate is treated with an etchant solution of the invention to remove resin smear that may have occurred during through-hole formation, and otherwise condition through-holes 16 and other apertures for subsequent plating.

Preferred etchant solution of the invention are aqueous permanganate solutions that have a pH (as determined at 25° C.) of 13 or less, more preferably about 12 or less, still more preferably about 11, 10, 9, 8 or less, or even substantially neutral, or even acidic, e.g. a pH of about 6 or less, or even a pH or about 4, 3, 2 or less.

Etchant solutions are typically aqueous solutions that contain from about 5 to 20 wt. % or more of a permanganate salt such as sodium permanganate or potassium permanganate. An aqueous solution that is 10 wt. % permanganate is generally preferred. The etchant solution contains a relatively weak alkaline component. Suitable bases to employ in etchant compositions of the invention include e.g. a carbonate such as $Na_2CO_3$ or $NaHCO_3$; a metasilicate, particularly sodium metasilicate; a phosphate such as sodium phosphate; and the like.

A printed circuit board or other substrate is suitably treated with an etchant composition of the invention by immersion, preferably with agitation of the etchant composition. The etchant composition is suitably at an elevated temperature, e.g. at least about 50° C. or 60° C., more typically about 70° C. or greater. Residence times of the substrate within the etchant composition can vary, e.g. immersion for 1 minute or more, to 3, 4, 5, 6, 7, 8, 9 or 10 minutes or more. See Example 1 which follows for a preferred etchant composition of the invention and preferred conditions of use of the composition.

As discussed, at least one, and preferably both of the sweller and etchant compositions of the invention are at least substantially free of added hydroxide component such as NaOH or KOH. More specifically, sweller and/or etchant solutions typically have an added hydroxide concentration that is less than 0.5 N or 0.01 N. More preferably, sweller and/or etchant compositions are at least essentially free of an added hydroxide component, and have an added hydroxide component concentration of less than 0.01 N or 0.001 N. It is particularly preferred that the sweller and/or etchant solutions of the invention are completely free of an added hydroxide component.

In the second aspect of the invention, after completion of any etch treatment, whether by conventional chemistries or by swell and etch solutions and processing in accordance with the first aspect of the invention, substrate 10 is then treated an aqueous acidic solution to leach out or otherwise remove ions (particularly cations) deposited on and within the substrate during prior processing as discussed above. After such acidic treatment, substrate 10 is preferably rinsed with water, preferably hot water such as 45° C. water.

The substrate is preferably rinsed with water after each processing step (i.e. swell treatment, etchant treatment, etc.), either by immersion or spray application, and typically with heated water, e.g. water at about 40° C. or 45° C. or greater.

Additional processing steps also may be employed in combination with the sweller and etchant treatment steps. For example, after treatment with an etchant composition, an electronic device substrate may be treated with a neutralizer composition such as an aqueous solution of sulfuric acid and one or more other acids.

As discussed above, the organic acid treatment of the invention can be conducted before or after the step of treatment with the neutralizer, and is preferably conducted together with a neutralization step. It is also possible to conduct the neutralizer and organic acid treatments in a single step, wherein the organic acid is added to the neutralizer formulation, which is generally preferred in order to reduce the overall number of processing steps.

The substrate may be treated with a surface cleaning composition prior to plating, e.g. an aqueous alkaline solution such as a tetraalkylammonium hydroxide solution, e.g. a 0.36 N tetramethylammonium hydroxide aqueous solution, sodium hydroxide aqueous solution, triethanolamine, etc. Such surface cleaning suitably is at any stage after the etchant treatment, and preferably may be performed after a neutralization step.

In Step 3, after such processing, through-holes and the device planar surfaces are then metallized by known processes to provide electrical interconnection between the circuit layers 12a and 12b. A typical procedure provides for a first electroless copper deposit on the aperature walls followed by electrolytic copper deposit over the electroless layer to enhance the initial electroless layer. A copper layer also can be directly electrolytically deposited on the dielectric through-hole walls. Suitable copper plating products, and other metal plating products, are commercially available from the Shipley Company of Marlborough, Mass. See also the above-cited *Printed Circuits Handbook* and *Printed Circuit Board Basics,* for a discussion of plating aperatures of electronic devices and other printed circuit board manufacturing processes. The examples which follow also disclose preferred plating protocols.

As discussed above, electronic devices produced by the methods of the invention are substantially more robust and reliable than comparable devices produced using prior pre-plating conditioning processes. For example, in standard pressure cooker treatment testing, multilayer printed circuit boards that are treated with sweller and etchant compositions of the invention and/or post-etchant organic acid treatment of the invention prior to through-hole plating typically exhibit about two orders of magnitude or less drop in measured resistance before and after the standard pressure cooker treatment, more typically about one order of magnitude or less drop in measured resistance before and after the standard pressure cooker treatment, preferably about one-half order of magnitude or less drop in measured resistance before and after the standard pressure cooker treatment. As referred to herein, a "standard pressure cooker treatment" refers to measuring resistance between 1 cm pads of a processed device prior to and then after exposure of the device to the following conditions: 100% relative humidity at 121° C. for 48 hours in a pressure cooker. See Example 1 which follows for a further description of such protocol of a standard pressure cooker treatment.

Multilayer printed circuit boards that are treated with sweller and etchant compositions of the invention and/or post-etchant organic acid treatment of the invention prior to through-hole plating also typically show no blistering or other problems between copper layers upon visual inspection after a standard pressure cooker treatment.

All documents mentioned herein are incorporated herein by reference. The following non-limiting examples are illustrative of the invention.

EXAMPLE 1

A first set and second set of double-sided circuit board substrates were employed that were a glass filled 18 $\mu$M copper clad BT resin (such resin available from Mitsubishi) substrate. A copper layer of each of the first and second sets of board substrates was coated with a negative-acting photoresist, and that resist was exposed to activating radiation and developed to provide a relief image of 1 cm diameter circles with a 1 mm wide and approximately 1.5 cm long copper "tail" (lead) etched. The resist was then stripped from each board substrate.

The remaining copper on each board was then chemically roughened and a negative-acting photoimageable dielectric (epoxy and phenol resins) was coated on each board to a thickness of 40 $\mu$m, and the coating layer thermally cured.

Each board sample was then treated with a swell and etch formulation as the formulations are defined below: the first set of board substrates were treated with the Standard Swell and Etch Formulations, as those formulations are defined below; and the second set of boards were treated with the Invention Swell and Etch Formulations, as those formulations are defined below.

Standard Swell and Etch Formulations:
  Sweller: aqueous solution containing sodium hydroxide and diethylene glycol/n-butyl ether
  Resin etch: aqueous solution of 10 wt % sodium permanganate and 10 wt % NaOH
  Neutralizer: aqueous solution containing glycolic acid and sulfuric acid
Invention Swell and Etch Formulations:
  Sweller: diethylene glycol/n-butyl ether and water
  Resin etch: aqueous solution of 10 wt % sodium permanganate and 10 wt % $Na_2CO_3$
  Neutralizer: aqueous solution containing glycolic acid and sulfuric acid The first set of board substrates was processed by the Standard Swell and Etch Formulations and neutralizer as follows. The first set of boards were immersed with agitation for 2.5 minutes in the Standard Swell Formulation (NaOH solution) that was at 80° C.; then immersed with agitation for 2.5 minutes in the Standard Etch Formulation (permanganate and NaOH) that was at 70° C.; and then immersed with agitation for 5 minutes in the neutralizer solution (glycolic acid and sulfuric acid) that was at 45° C. The board substrates were rinsed with 45° C. water after each immersion treatment.

The second set of board substrates was processed by the Invention Swell and Etch Formulations and neutralizer as follows. The first set of boards were immersed with agitation for 5 minutes in the Invention Swell Formulation (aqueous diethylene glycol/n-butyl ether without added base) that was at 80° C.; then immersed with agitation for 7.5 minutes in the Invention Etch Formulation (permanganate and $Na_2CO_3$) that was at 70° C.; and then immersed with agitation for 5 minutes in the neutralizer solution (glycolic acid and sulfuric acid) that was at 45° C. The treated substrates were then treated by immersion with agitation for 5 minutes in a surface cleaning formulation (0.36 N tetramethylammonium hydroxide solution) that was at 35° C. The board substrates were rinsed with 45° C. water after each immersion treatment, except after the surface cleaning treatment where the board substrates were rinsed with room temperature water.

Thereafter, the first and second board substrates were copper plated by electroless and then electrolytic procedures as follows. The board substrates were plated with electroless copper 328 (available from the Shipley Company), then baked at 120° C. for 1 hour, placed in a 10% aqueous sulfuric acid cleaner solution and then placed directly (no rinse) into a copper electrolytic plating solution EP 1100 (available from the Shipley Company) to deposit a 25 micron electrolytic copper layer over the electroless layer. The substrates were then baked at 150° C. for 1 hour and then patterned with a negative photoresist. Leads were soldered on as desired in the high voltage test below, and the high voltage testing conducted.

High Voltage Test

Leads were soldered to the "tails" present on each of the first and second board copper layers. 2000V were passed between the 1 cm pads on each of the boards. Defective samples short out. 15% of the samples (n=20) treated with the Standard Swell and Etch Formulations shorted out, while none of the samples (n=20) treated the Invention Swell and Etch Formulations showed shorts.

Volume Resistivity/Pressure Cooker Treatment

Resistance was measured between the 1 cm pads of each of the first and second layers, and then the samples were placed in 100% relative humidity, 121° C. and 2.1 atm pressure cooker for 48 hours. The samples were then removed from the pressure cooker and resistance was measured again. Samples prepared using the Standard Swell and Etch Formulations had a resistance of $1\times10^{13}$ prior to the pressure cooker treatment, and a resistance of $1\times10^{10}$ after the pressure cooker treatment, a drop of three orders of magnitude. Samples prepared using the Invention Swell and Etch Formulations had a resistance of $2\times10^{13}$ prior to the pressure cooker treatment, and a resistance of $5\times10^{12}$ after the pressure cooker treatment, a drop of only one half order of magnitude.

Pressure Cooker Treatment Visual Inspection

The tested samples also were visually evaluated before and then after the above-described pressure cooker treatment. Pre-pressure cooker samples prepared using either the Standard Swell and Etch Formulations or the Invention Swell and Etch Formulations showed no evidence of blistering. After the pressure cooker treatment (again, 100% RH, 121° C., 2.1 atm), samples were inspected and all samples which were prepared using the Standard Swell and Etch Formulations showed severe resin to resin blisters between the first and second resin layers. Samples prepared using the Invention Swell and Etch Formulations were visually inspected after pressure cooker treatment, and no blistering or other problems were observed.

EXAMPLE 2

A first set and second set of double-sided circuit board substrates were employed that were a glass filled 18 μM copper clad BT resin (such resin available from Mitsubishi) substrate. The first and second board sets were treated as described above in Example 1 with the Standard Swell and Etch Formulations and neutralizer. The second set of boards were treated with the neutralizer of Example 1 above. The first set of boards were treated with a neutralizer composition that had the following composition: an aqueous solution that was 30 wt % lactic acid, and sulfuric acid and glycolic acid in the same concentrations as in the neutralizer composition of Example 1 above.

The first and second board substrates were analyzed via the pressure cooker test as described in Example 1 above. After that pressure cooker test, the first set of board substrates showed better volume resistivity and visual inspection than the second set of board substrates. The first set of board substrates also showed lower ion contamination relative to the second set of board substrates as determined by EPX (energy dissipative X-ray microanalysis).

The foregoing description of the present invention is merely illustrative thereof, and it is understood that variations and modifications can be made without departing from the spirit or scope of the invention as set forth in the following claims.

What is claimed is:

1. A method for treating an electronic device substrate for subsequent plating of the device, wherein the substrate has one or more apertures having walls of the substrate having an exposed resin material; the method comprising:

(a) contacting the substrate with a first solution, and thereafter (b) contacting the substrate with a second aqueous solution comprising permanganate, and wherein at least one of the first and second solutions have a pH of about 13 or less and are at least substantially free of an added hydroxide component.

2. A method of claim 1 wherein both the first and second compositions have a pH of about 13 or less.

3. A method of claim 1 wherein the first solution has a pH of about 12 or less.

4. A method of claim 1 wherein the first solution has a pH of about 10 or less.

5. A method of claim 1 wherein both the first and second solutions have a pH of about 12 or less.

6. A method of claim 1 wherein the first solution comprises a water-miscible organic solvent.

7. A method of claim 1 wherein the first solution does not have an added alkaline component.

8. A method of claim 1 wherein the second solution comprises an added carbonate component, an added organic base component or an added substituted ammonium component.

9. A method of claim 1 wherein the aperture walls are contacted with an organic acid after treatment with the second composition.

10. A method of claim 9 wherein after treatment with second composition, the aperature walls are contacted with a neutralizer composition, and thereafter the aperature walls are contacted with a separate organic acid.

11. A method of claim 1 wherein the substrate is contacted with an aqueous solution of an organic acid.

12. A method of claim 9 wherein the aperture walls are plated with copper after contacting the walls with the organic acid.

13. A method for treating one or more apertures of an electronic device substrate for subsequent plating of the device, the one or more apertures having walls of an exposed resin material, the method comprising:

(a) contacting the aperture walls with an etchant composition, comprising a permanganate salt that can remove resin smear from the aperture walls, wherein the etchant composition has a pH of about 13 or less, wherein the etchant composition is substantially free of added hydroxide componet, wherein the etchant composition comprises a carbonate and thereafter (b) contacting the aperture walls with an organic acid.

14. A method of claim 13 wherein the organic acid comprises one or more carboxyl groups and one or more hydroxyl groups.

15. A method of claim 13 wherein the organic acid is propionic acid, lactic acid or acetic acid.

16. A method of claim 13 wherein after treatment with the etchant composition, the aperature walls are contacted with an organic acid that is formulated as an aqueous solution having the organic acid in a concentration of at least about 10 weight percent.

17. A method of claim 13 wherein after treatment with the etchant composition, the aperature walls are contacted with a neutralizer composition and thereafter with the organic acid.

18. A method of claim 13 wherein the aperture walls are plated with copper after contacting the walls with the organic acid.

* * * * *